United States Patent
Chen

(10) Patent No.: US 9,867,311 B2
(45) Date of Patent: Jan. 9, 2018

(54) SERVER CABLE MANAGEMENT STRUCTURE

(71) Applicant: GSLIDE CORPORATION, New Taipei (TW)

(72) Inventor: Yung-Liang Chen, Taipei Shien (TW)

(73) Assignee: GSLIDE CORPORATION, New Taipei (TW)

( * ) Notice: Subject to any disclaimer, the term of this patent is extended or adjusted under 35 U.S.C. 154(b) by 0 days.

(21) Appl. No.: 15/436,211

(22) Filed: Feb. 17, 2017

(65) Prior Publication Data

US 2017/0245389 A1  Aug. 24, 2017

(30) Foreign Application Priority Data

Feb. 22, 2016 (TW) .............................. 105105114 A

(51) Int. Cl.
| | | |
|---|---|---|
| *F16L 3/22* | (2006.01) | |
| *H05K 7/14* | (2006.01) | |
| *F16L 3/015* | (2006.01) | |

(52) U.S. Cl.
CPC ............ *H05K 7/1491* (2013.01); *F16L 3/015* (2013.01)

(58) Field of Classification Search
USPC ........................................................ 248/68.1
See application file for complete search history.

(56) References Cited

U.S. PATENT DOCUMENTS

| 6,305,556 B1 * | 10/2001 | Mayer ....................... G06F 1/18 |
| --- | --- | --- |
| | | 211/175 |
| 7,473,846 B2 * | 1/2009 | Doerr ................... H05K 7/1491 |
| | | 174/68.3 |
| 7,712,615 B2 * | 5/2010 | Chen ..................... H01R 9/2416 |
| | | 174/69 |
| 7,789,350 B2 * | 9/2010 | Yu ........................ H05K 7/1491 |
| | | 248/56 |
| 8,251,321 B2 * | 8/2012 | Chen .................... H05K 7/1491 |
| | | 248/298.1 |
| 8,634,198 B2 * | 1/2014 | Chen .................... H05K 7/1491 |
| | | 174/68.3 |
| 9,072,190 B2 * | 6/2015 | Chen .................... H05K 7/1491 |
| 9,072,194 B2 * | 6/2015 | Chen .................... H05K 7/1421 |
| 9,144,174 B2 * | 9/2015 | Chen .................... H05K 7/1421 |

(Continued)

FOREIGN PATENT DOCUMENTS

TW  201428911 A  7/2014

*Primary Examiner* — Monica E Millner
(74) *Attorney, Agent, or Firm* — Cook Alex Ltd.

(57) ABSTRACT

A server cable management structure includes a first arm member and a second arm member respectively pivotally coupled to the outer and inner sliding rails of a sliding rail assembly which is connected to a drawer of a server. An intermediate arm member is pivotally coupled between the first and second arm members, and a sliding bar is slidably coupled to the first arm member, with at least one spring member connected between the first arm member and the sliding bar, and a connection frame connected to the sliding bar and pivotally connected to the outer sliding rail. The inner sliding rail is movable outward a first distance when the first arm member is fully extended outward relative to the second arm member, and outward a further distance while stretching the at least one spring member when the sliding bar is fully extended outward relative to the first arm member.

7 Claims, 8 Drawing Sheets

(56) References Cited

U.S. PATENT DOCUMENTS

| | | | |
|---|---|---|---|
| 9,402,329 B1* | 7/2016 | Chen | F16L 3/08 |
| 9,474,182 B1* | 10/2016 | Chen | H05K 7/1489 |
| 9,640,961 B2* | 5/2017 | Chen | H02G 3/32 |
| 2003/0026084 A1* | 2/2003 | Lauchner | H05K 7/1491 |
| | | | 361/826 |
| 2005/0145582 A1* | 7/2005 | Dubon | H02G 3/128 |
| | | | 211/26 |
| 2006/0081735 A1* | 4/2006 | Chen | F16L 3/01 |
| | | | 248/68.1 |
| 2006/0081736 A1* | 4/2006 | Chen | H01R 9/2416 |
| | | | 248/68.1 |
| 2006/0113433 A1* | 6/2006 | Chen | H05K 7/1491 |
| | | | 248/70 |
| 2007/0017883 A1* | 1/2007 | Bridges | H05K 7/1491 |
| | | | 211/26 |
| 2010/0193646 A1* | 8/2010 | Chen | H02G 3/0456 |
| | | | 248/70 |
| 2011/0228473 A1* | 9/2011 | Anderson | G02B 6/4452 |
| | | | 361/679.58 |
| 2013/0233980 A1* | 9/2013 | Chen | H05K 7/1491 |
| | | | 248/70 |
| 2016/0161026 A1* | 6/2016 | Chen | F16L 3/015 |
| | | | 248/70 |
| 2016/0309611 A1* | 10/2016 | Yi | A47B 21/06 |

* cited by examiner

SERVER CABLE MANAGEMENT STRUCTURE

BACKGROUND OF THE INVENTION

Field of the Invention

The present invention relates to server cable management technology and more particularly, to a server cable management structure, which allows a drawer of a server to be pulled outward a further distance, after the arm members of the server cable management structure have been extended outward with the outward movement of the drawer. This facilitates movement of the drawer outward a further distance with controlled further extension of the cabling, and provides convenient access, effectively meeting the needs of the user.

Description of the Related Art

The distance between two opposite lateral frame racks of a server frame of a server is fixed and uniform. In a typical server the distance between two opposite lateral frame racks of the server frame is 450 mm. Because the typical cable management structure is folded behind the drawer, the longest front-to-back distance of the fully extended length of the server cable management structure is no more than 2×450 mm, so it does not exceed 900 mm. This limits the sliding range of the inner sliding rail of the sliding rail assembly that is connected to the drawer, resulting in restriction of the outward movement distance of the drawer, and causing the user inconvenience and distress.

Further, Taiwan Patent No. I525761 discloses an adjustment mechanism for a cable management system that allows the user to adjust the pull out length of the cable management system according to actual needs. However, it still does not provide a convenient way to adjust the pull out length of the cable management system.

SUMMARY OF THE INVENTION

The present invention seeks to overcome disadvantages in the prior art. It is therefore the main object of the present invention to provide a server cable management structure, which is configured so that when the user pulls out the drawer of the server, a first arm member, intermediate arm member and second arm member of the server cable management structure are moved with the drawer and extended outward; when the first arm member is fully extended outward relative to the second arm member, a sliding bar of the server cable management structure can then be moved outward relative to a longitudinal sliding groove of the first arm member to stretch spring members, allowing the drawer to be pulled outward a further distance, and thus, the invention facilitates a greater pull out distance, with controlled further extension of the cabling, and convenient access, effectively meeting the needs of the user.

It is another object of the present invention to provide a server cable management structure configured so that when the user stops pulling the drawer outward, the elastic restoring energy of the spring members immediately pulls back the sliding bar, ensuring smooth use of the server cable management structure.

To achieve these and other objects of the present invention, a server cable management structure comprises a first arm member, a second arm member, an intermediate arm member, a first connection member, a second connection member and a plurality of cable holders. The intermediate arm has two opposite ends thereof respectively pivotally connected to one end of the first arm member by a first pivot pin and to one end of the second arm member by a second pivot pin. The first connection member and the second connection member are respectively affixed to an outer sliding rail and to an inner sliding rail of a sliding rail assembly, and respectively pivotally connected with an opposite end of the first arm member by a third pivot pin and to an opposite end of the second arm member by a fourth pivot pin. The cable holders are respectively mounted on the first arm member, the intermediate arm member and the second arm member. Further, the first arm member comprises a longitudinal sliding groove disposed at one end thereof opposite to the inner sliding rail of the sliding rail assembly and extended along a length proximate the one end thereof. The server cable management structure further comprises a locating block connected to the first arm member near an inner end of the longitudinal sliding groove by at least one first fastening member, a sliding bar coupled to and movable along the longitudinal sliding groove, at least one spring member, with each spring member having one end thereof connected to the locating block and an opposite end thereof connected to the sliding bar, and a connection frame connected to the sliding bar by at least one second fastening member and pivotally connected to the first connection member by the third pivot pin.

Thus, when the inner sliding rail of the sliding rail assembly is moved with the drawer toward the outside of the server, the first arm member, intermediate arm member and second arm member of the server cable management structure are moved with the drawer and extended outward. The combination of the first arm member, intermediate arm member and second arm member allow the pull out distance to be greater than would occur if using only two arms that fold behind the drawer. Also, when the first arm member is fully extended outward relative to the second arm member, the sliding bar can then be moved relative to the longitudinal sliding groove of the first arm member to stretch the spring members, allowing the drawer to be pulled out an even further distance. Thus, the invention facilitates a greater pull out distance, with controlled further extension of the cabling, and providing convenient access to meet the needs of the user. Further, when the user stops pulling the drawer outward, the elastic restoring energy of the spring members immediately pulls back the sliding bar, ensuring smooth use of the server cable management structure.

BRIEF DESCRIPTION OF THE DRAWINGS

FIG. 4 corresponds to FIG. 2, and is a perspective assembly view illustrating the sliding bar extended outward from a longitudinal sliding groove of the first arm member.

DETAILED DESCRIPTION OF THE PREFERRED EMBODIMENT

Figure 1:
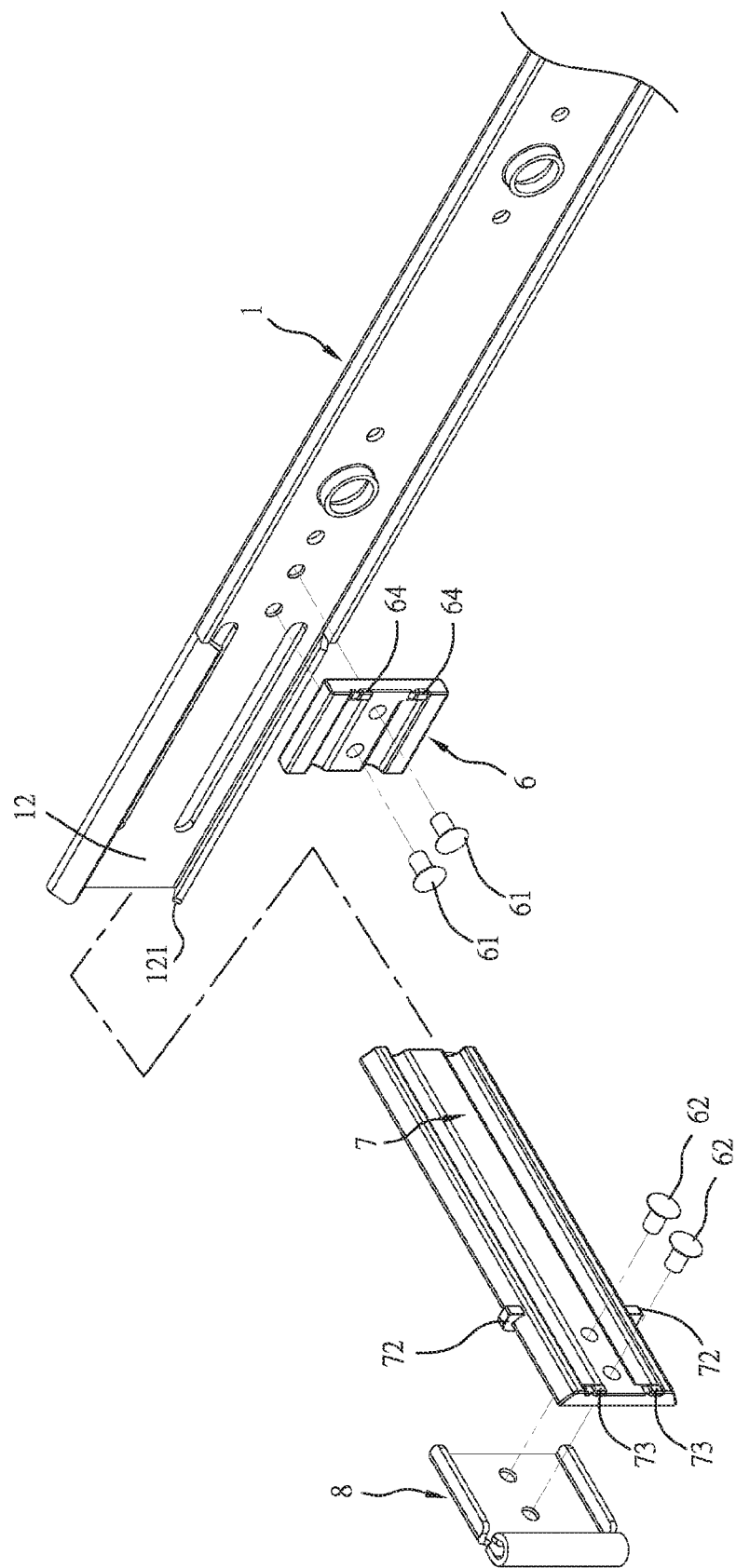
FIG. 1 is an exploded perspective view of a sliding bar and a first arm member of a server cable management structure in accordance with the present invention (spring members excluded).
Figure 2:
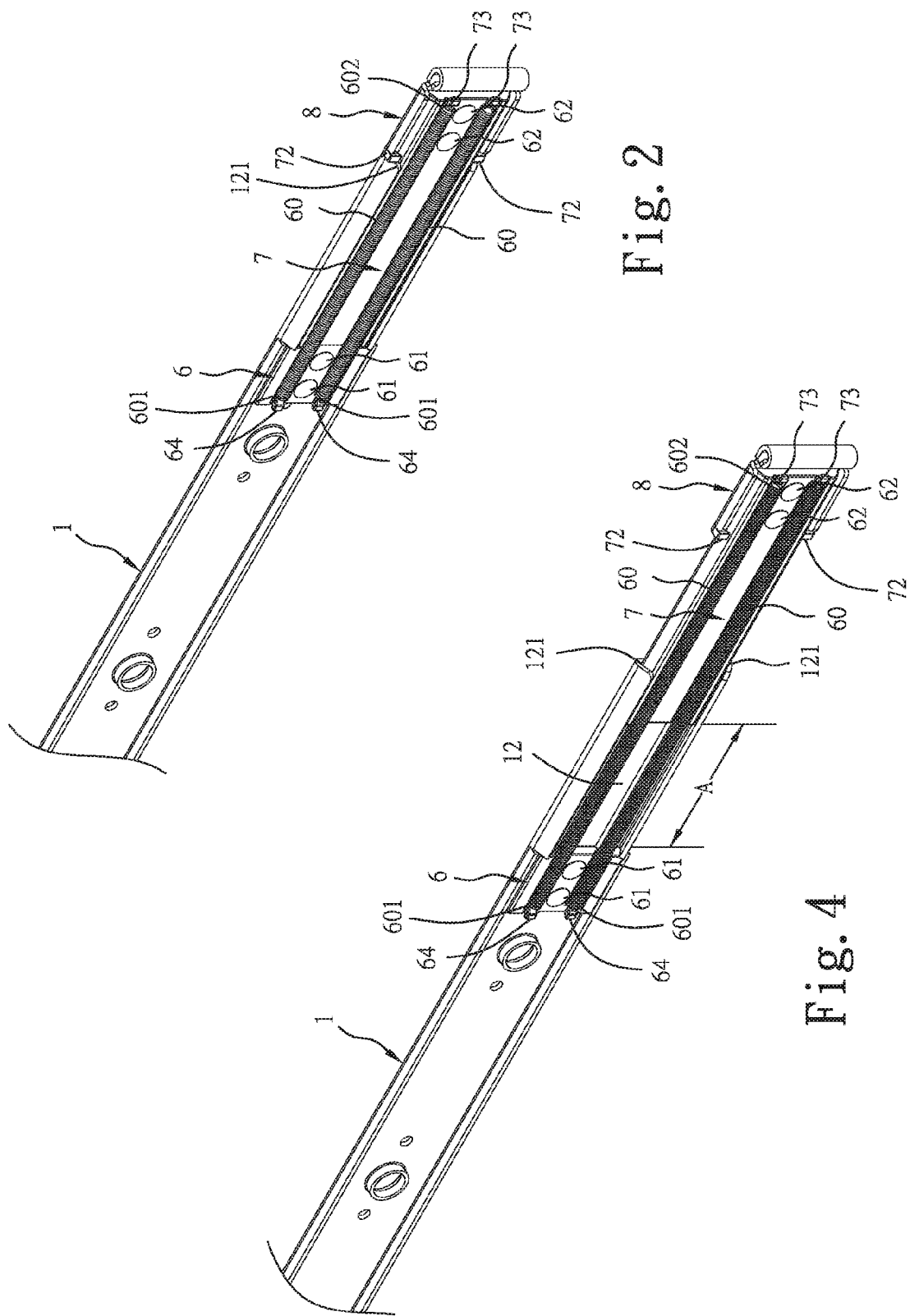
FIG. 2 is a perspective assembly view of the sliding bar within the longitudinal sliding groove of the first arm member of the server cable management structure.
Figure 3:
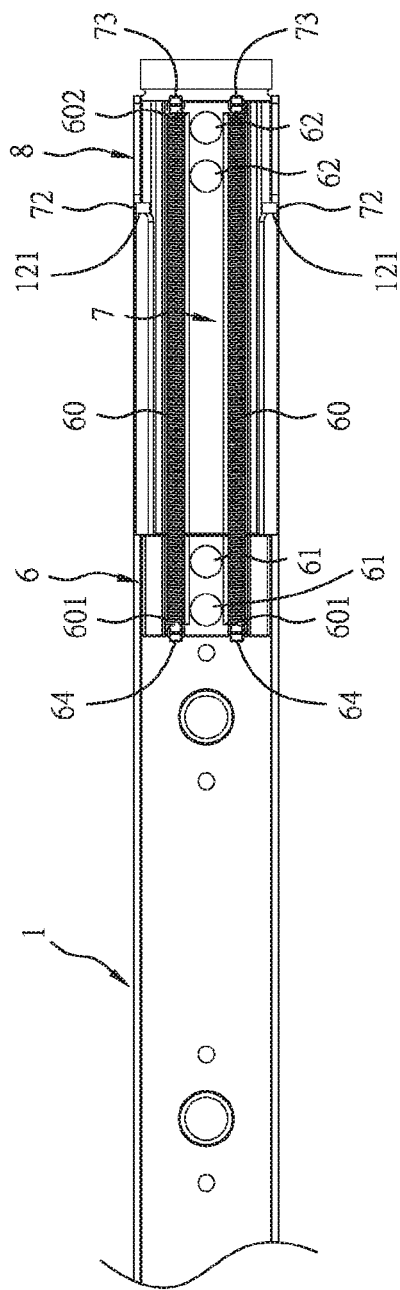
FIG. 3 is a side plan view of the assembly shown in FIG. 2.

Referring to FIGS. 1-10, a server cable management structure 10 in accordance with the present invention is shown. The server cable management structure 10 comprises a first arm member 1, an intermediate arm member 2 and a second arm member 3 (see FIG. 6). The intermediate arm member 2 has two opposite ends thereof respectively pivotally connected to one end 11 of the first arm member 1 by a first pivot pin 21 and to one end 31 of the second arm member 3 by a second pivot pin 22 (see FIG. 6). The opposite end of the first arm member 1 and the opposite end of the second arm member 3 are respectively pivotally connected to a first connection member 41 by a third pivot pin 23 and to a second connection member 42 by a fourth pivot pin 24 (see FIG. 6 and FIG. 7). The first and second connection members 41, 42 are respectively connected to the outer sliding rail 511 and inner sliding rail 512 of one of two opposite sliding rail assemblies 51 (see FIGS. 8-10) in a server frame of a server (not shown). The inner sliding rail 512 is connected to a drawer (not shown). When the drawer is pulled outward of the server, the first arm member 1, the intermediate arm member 2 and the second arm member 3 are extended outward by the movement of the second connection member 42 with the inner sliding rail 512. The server cable management structure 10 further comprises a plurality of cable holders 43 respectively mounted on the first arm member 1, the intermediate arm member 2 and the second arm member 3 (see FIGS. 6-10) for the management of cables.

Figure 5:
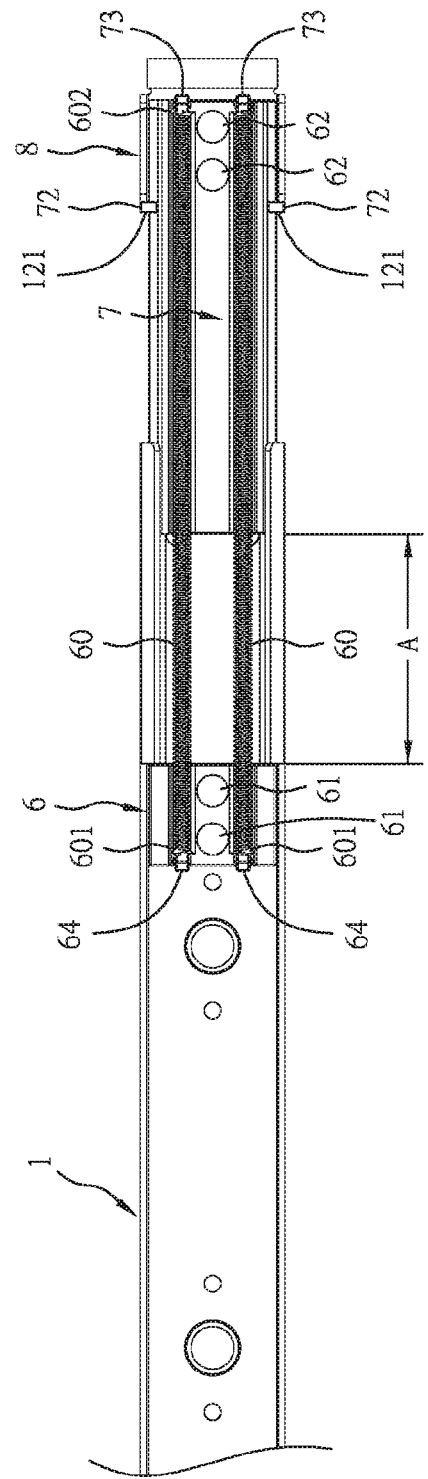
FIG. 5 is a side plan view that corresponds to FIG. 3, illustrating the sliding bar extended outward from the longitudinal sliding groove of the first arm member.
Figure 6:
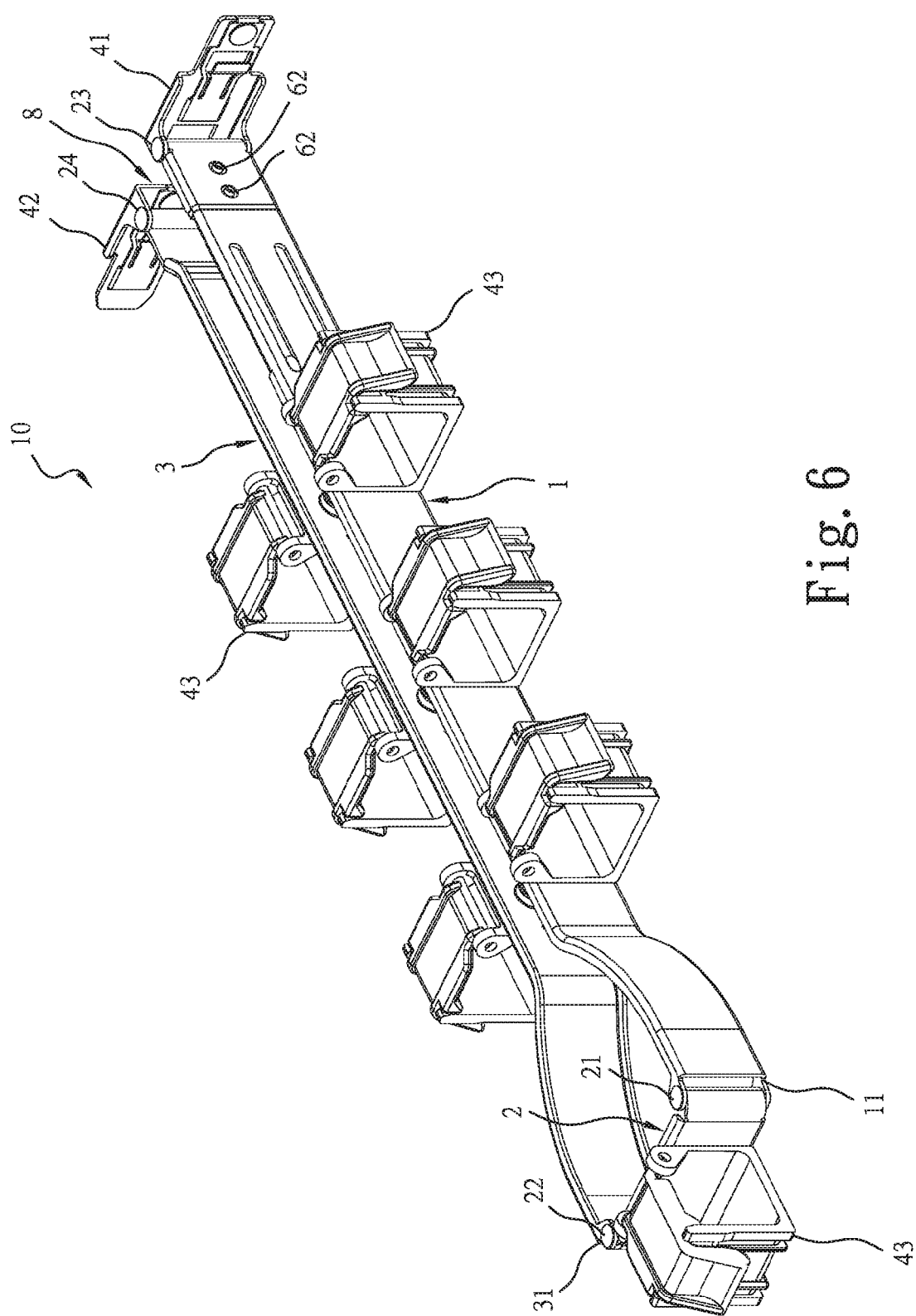
FIG. 6 is a perspective top view of the server cable management structure in accordance with the present invention, while not connected to an outer sliding rail and an inner sliding rail of a sliding rail assembly.
Figure 7:
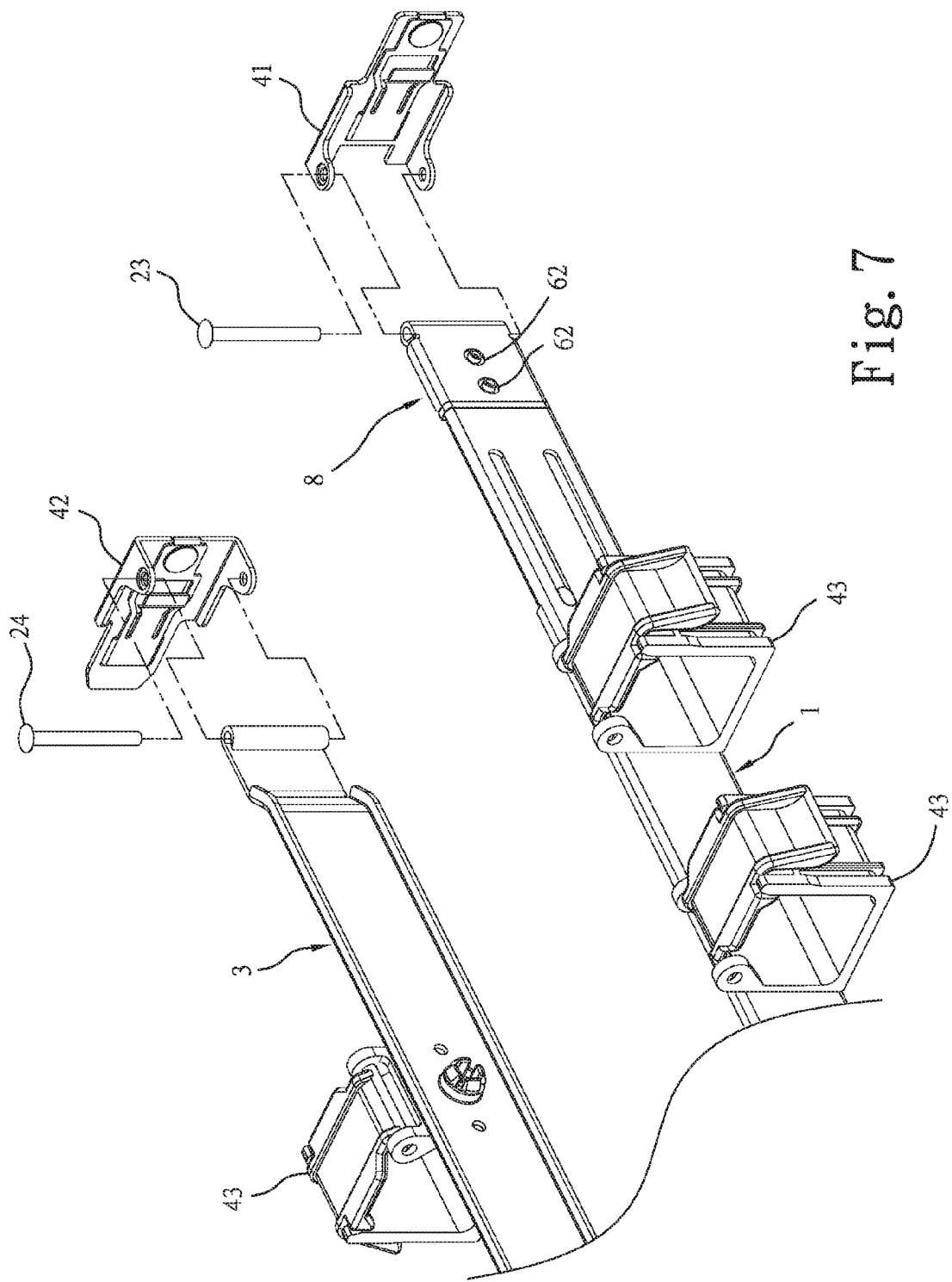
FIG. 7 is an exploded perspective view of other parts of the server cable management structure in accordance with the present invention that are connected to the outer sliding rail and to the inner sliding rail of a sliding rail assembly.
Figure 8:
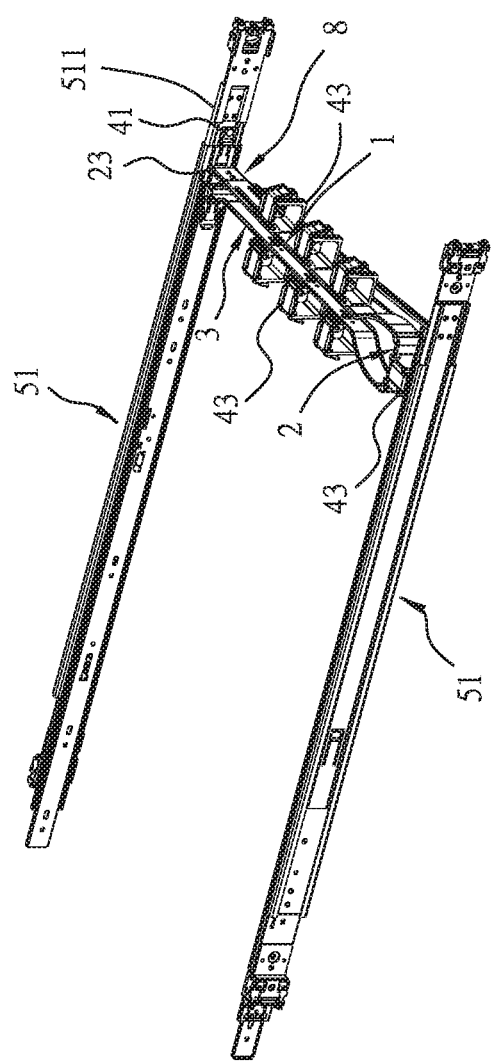
FIG. 8 is a schematic perspective top view of the present invention, illustrating an operation status of the server cable management structure at the rearmost position of travel.
Figure 9:
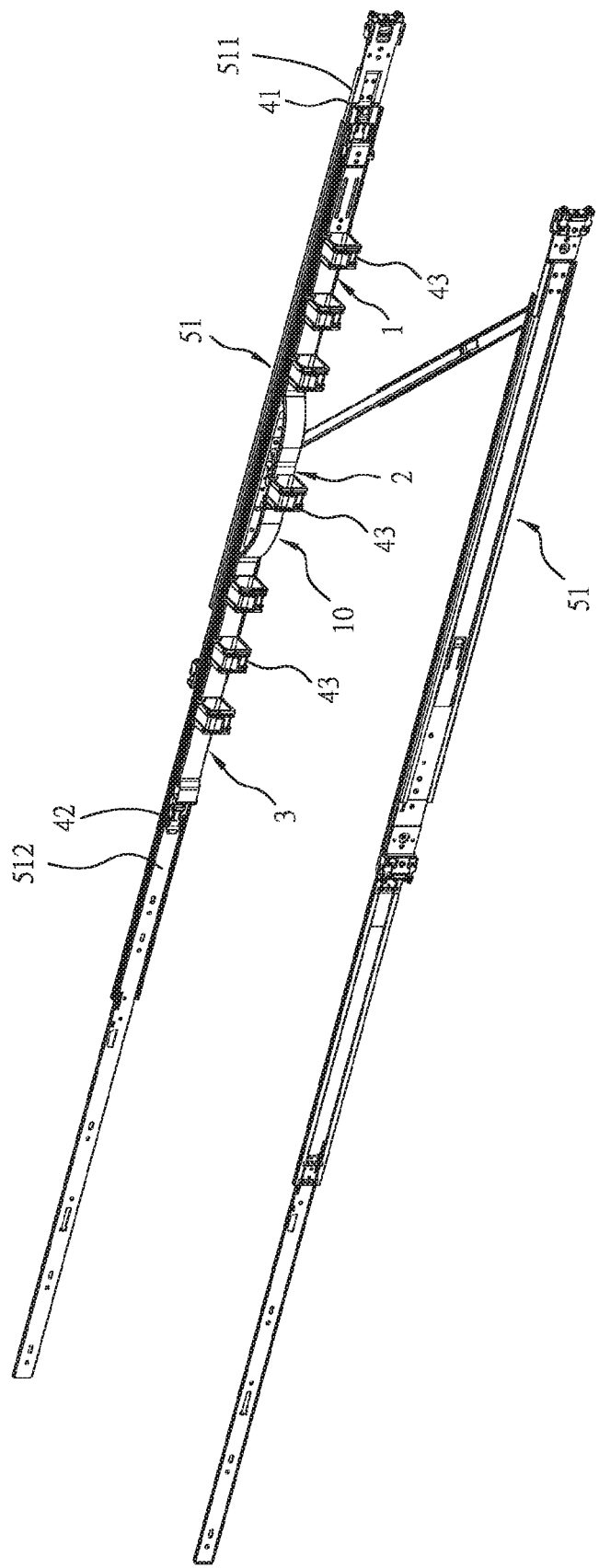
FIG. 9 is a schematic perspective top view of the present invention, illustrating an operation status of the server cable management structure at a first extended outward positon of travel.
Figure 10:
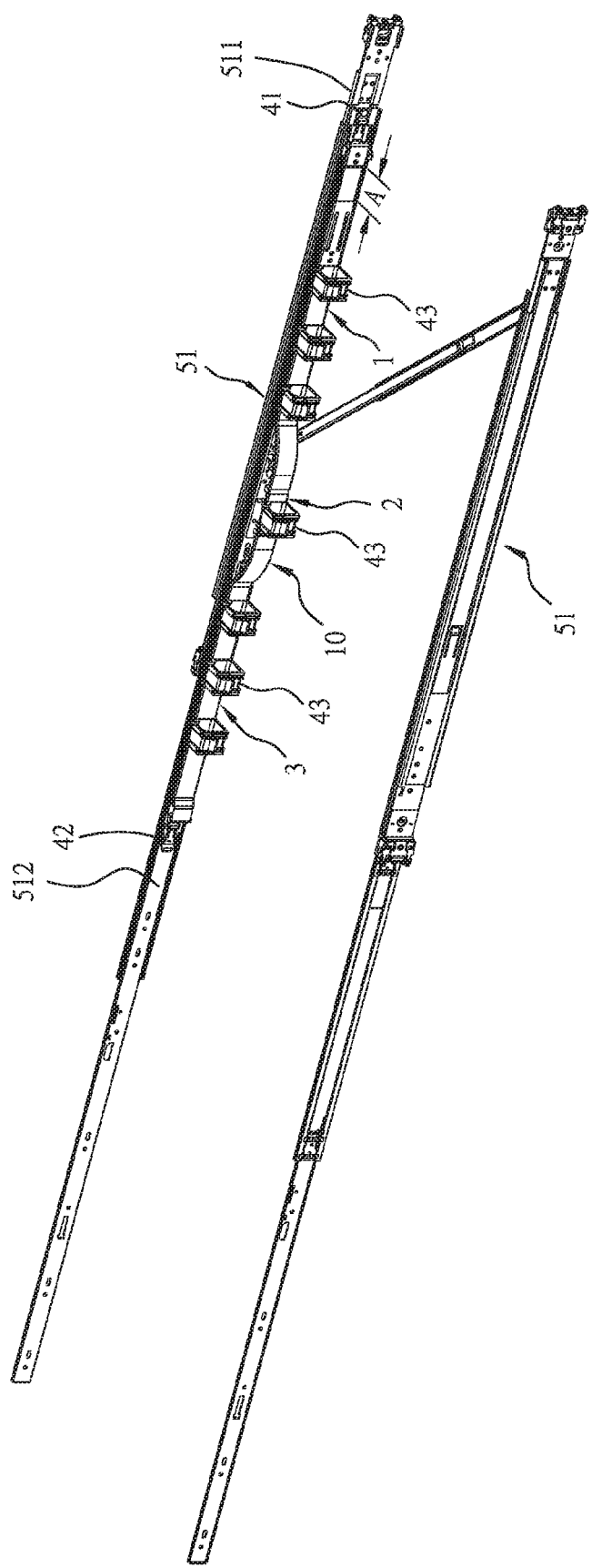
FIG. 10 is a schematic perspective top view of the present invention, illustrating an operation status of the server cable management structure at a forward most extended outward position of travel.

The first arm member 1 has a longitudinal sliding groove 12 disposed at one end thereof opposite to the inner sliding rail 512 of the sliding rail assembly 51 and extended along a length through the one end thereof (see FIGS. 1, 4 and 5). The server cable management structure 10 further comprises a locating block 6 connected to the first arm member 1 near the longitudinal sliding groove 12 by first fastening members 61 (see FIGS. 1-5), a sliding bar 7 coupled to and movable along the longitudinal sliding groove 12 (see FIGS. 1-5), at least one spring member 60, shown in this example as two spring members 60, each having one end 601 thereof respectively connected to the locating block 6 and an opposite end 602 thereof connected to the sliding bar 7 (see FIGS. 1-5), and a connection frame 8 connected to the sliding bar 7 by second fastening members 62 (see FIGS. 1-5) and pivotally connected to the first connection member 41 by the aforesaid third pivot pin 23 (see FIGS. 6 and 7).

Further, the locating block 6 comprises at least one first spring positioning element, shown in this example as two first hook blocks 64 to which the respective one ends 601 of the spring members 60 are connected. The sliding bar 7 comprises at least one second spring member positioning element, shown in this example as two second hook blocks 73 to which the respective opposite ends 602 of the spring members 60 are connected.

The sliding bar 7 further comprises a stop block 72 (see FIGS. 1-5) located at an outer end thereof and which stops against an outer end 121 at the outer end edge of the longitudinal sliding groove 12, limiting the sliding distance of the sliding bar 7 relative to the longitudinal sliding groove 12.

Thus, the server cable management structure 10 of the present invention provides advantages such that when the inner sliding rail 512 of the sliding rail assembly 51 is moved to an extended position with the drawer (not shown) toward the outside of the server (not shown), the first arm member 1, intermediate arm member 2 and second arm member 3 of the server cable management structure 10 are moved with the drawer and extended outward a distance greater than would occur if using only two arms that fold behind the drawer. When the first arm member 1 is fully extended outward relative to the second arm member 3 (see FIG. 9), the sliding bar 7 can then be moved out of the longitudinal sliding groove 12 of the first arm member 1 while stretching the spring members 60, thereby allowing the drawer 50 to be pulled outward an even further distance A (see FIG. 4, FIG. 5 and FIG. 10). Thus, the invention facilitates movement of the drawer outward a further distance with controlled extension of the cabling and can meet the needs of the user. Further, when the user stops pulling the drawer, the elastic restoring energy of the spring members 60 immediately pulls back the sliding bar 7 (from the position in FIG. 4 and FIG. 5 to the position in FIG. 2 and FIG. 3), ensuring smooth use of the server cable management structure 10.

Although a particular embodiment of the present invention has been described in detail for purposes of illustration, various modifications and enhancements may be made without departing from the spirit and scope of the invention. Accordingly, the invention is not to be limited except as by the appended claims.

What is claimed is:

1. A server cable management structure, comprising:
   a first arm member;
   a second arm member;
   an intermediate arm member, said intermediate arm having two opposite ends thereof respectively pivotally connected to one end of said first arm member by a first pivot pin and to one end of said second arm member by a second pivot pin;
   a first connection member and a second connection member respectively affixed to an outer sliding rail and to an inner sliding rail of a sliding rail assembly and respectively pivotally connected with an opposite end of said first arm member by a third pivot pin and to an opposite end of said second arm member by a fourth pivot pin; and
   a plurality of cable holders respectively mounted on said first arm member, said intermediate arm member and said second arm member;
   wherein:
   said first arm member comprises a longitudinal sliding groove disposed at one end thereof opposite to said inner sliding rail of said sliding rail assembly and extended along a length proximate the one end thereof;
   the server cable management structure further comprises a locating block connected to said first arm member near an inner end of said longitudinal sliding groove by at least one first fastening member, a sliding bar coupled to and movable along said longitudinal sliding groove, at least one spring member, with each said spring member having one end thereof connected to said locating block and an opposite end thereof connected to said sliding bar, and a connection frame connected to said sliding bar by at least one second fastening member and pivotally connected to said first connection member by said third pivot pin.

2. The server cable management structure as claimed in claim 1, wherein said locating block comprises a first spring member positioning element connected to one end of each said spring member; and said sliding bar comprises at least one second spring member positioning element connected to an opposite end of each said spring member.

3. The server cable management structure as claimed in claim 2, wherein said first spring member positioning element further comprises at least one first hook block connected to said one end of said at least one spring member, and said second spring member positioning element further comprises at least one second hook block connected to said opposite end of said at least one spring member.

4. The server cable management structure as claimed in claim 1, wherein said sliding bar comprises a stop block located at an outer end thereof and which stops against an outer end of said longitudinal sliding groove of said first arm member, limiting the sliding distance of said sliding bar relative to said longitudinal sliding groove.

5. The server cable management structure as claimed in claim 1, wherein said inner sliding rail is extendable outward a first distance relative to said outer sliding rail via connection to said first arm member, said intermediate arm member and said second arm member, and wherein said inner sliding rail is extendable outward a second distance relative to said outer sliding rail via said sliding bar being slidably movable relative to said longitudinal groove.

6. The server cable management structure as claimed in claim 5, wherein said at least one spring member is stretched when extending said inner sliding rail outward relative to said outer sliding rail from said first distance to said second distance.

7. The server cable management structure as claimed in claim 6, wherein elastic restoring energy of said at least one spring member pulls said inner sliding rail back inward relative to said outer sliding rail from said second distance to said first distance.

* * * * *